United States Patent
Fukuyama

[19]

[11] Patent Number: 6,025,740
[45] Date of Patent: Feb. 15, 2000

[54] CLOCK FEEDING CIRCUIT AND METHOD FOR ADJUSTING CLOCK SKEW

[75] Inventor: Hiroyuki Fukuyama, Tokyo, Japan

[73] Assignee: Oki Electric Industry Co., Ltd., Tokyo, Japan

[21] Appl. No.: 08/115,662

[22] Filed: Sep. 3, 1993

[30] Foreign Application Priority Data

Sep. 8, 1992 [JP] Japan ................................... 4-239754

[51] Int. Cl.[7] .................................................. H03K 19/00
[52] U.S. Cl. ............................................. 326/93; 326/101
[58] Field of Search ................................ 307/480, 482.1, 307/269, 443, 465.1, 597; 364/488–491; 326/93, 101, 21, 47; 395/500.02, 500.19

[56] References Cited

U.S. PATENT DOCUMENTS

| | | | |
|---|---|---|---|
| 4,769,558 | 9/1988 | Bach | 307/480 |
| 4,812,684 | 3/1989 | Yamagiwa et al. | 307/480 |
| 4,851,717 | 7/1989 | Yabe | 307/480 |
| 4,857,765 | 8/1989 | Cahill et al. | 307/480 |
| 4,868,522 | 9/1989 | Popat | 307/269 |
| 5,012,427 | 4/1991 | Kuribayashi | 307/480 |
| 5,013,942 | 5/1991 | Nishimura | 307/480 |
| 5,029,279 | 7/1991 | Sasaki et al. | 307/303.1 |
| 5,043,596 | 8/1991 | Masuda | 307/269 |
| 5,077,676 | 12/1991 | Johnson | 364/488 |
| 5,122,679 | 6/1992 | Ishii | 307/269 |
| 5,164,817 | 11/1992 | Eisenstadt et al. | 307/480 |
| 5,172,330 | 12/1992 | Watanabe et al. | 307/480 |
| 5,204,559 | 4/1993 | Deyhimy | 307/269 |
| 5,264,746 | 11/1993 | Ohmae | 307/269 |
| 5,270,592 | 12/1993 | Takeashi | 307/482.1 |

FOREIGN PATENT DOCUMENTS 1-157115  6/1989  Japan .

*Primary Examiner*—Jon Santamauro
*Attorney, Agent, or Firm*—Rabin & Champagne, P.C.

[57] ABSTRACT

A clock feeding circuit for an integrated circuit includes logic circuit regions, a clock signal source, an input buffer connected to the source, and delay adjusting circuits. Each logic circuit region has a plurality of logic circuits, a buffer circuit for receiving the clock signal and providing it to the logic circuits, and interconnections wiring the logic circuits to the buffer circuit such that clock skew is minimized in the region. The adjusting circuits are disposed between the buffer and the respective logic circuit regions. Each adjusting circuit is composed of a plurality of delay elements, the number of which is pre-selected to determine the delay of the clock signal passing through it. A method for designing the integrated circuit includes (a) creating a schematic representation of the integrated circuit, (b) determining a layout and interconnections of each region, by which the clock skew in the regions is minimized among the logic circuits of each region, including simulating transmission of a clock signal from the clock source to each region to determine delays times of the clock signal from the clock source to the logic circuits; and (c) determining adjustments to the delay circuits which provide a minimum difference among time delays for the clock signal to reach one logic circuit in each region.

12 Claims, 5 Drawing Sheets

CLOCK FEEDING CIRCUIT AND METHOD FOR ADJUSTING CLOCK SKEW

CROSS-REFERENCE TO RELATED APPLICATIONS

This application claim priority benefits under 35 USC § 119 of Japanese Application Serial No. Hei 4-239,754, filed Sep. 8, 1992, the entire disclosure of which is incorporated herein by reference.

BACKGROUND OF THE INVENTION

1. Field of the Invention

This invention relates to clock feeding circuitry in an integrated circuit, and a method for adjusting clock skew in such integrated circuits, especially in semi-custom-made LSI's with interconnections designed by users, namely, in sea-of-gates type LSI's.

2. Description of the Related Art

In a clock feeding circuit for feeding clock pulses to activate logic circuits on an IC chip, differences of delay time, that is, clock skew, of the clock pulses input to logic circuits, may occur between the logic circuits. This is because lengths of interconnection routes from inputs of the clock feeding circuit to the respective logic circuits, and loads of such circuits, may differ.

In order to reduce the clock skew, circuits for distributing clock pulses as described in Japanese Patent Unexamined Publication No. Hei 1-157,115 (dated Jun. 20, 1989) and the copending application for United States patent of applicants assignee, Ser. No. 933,345 (filed Aug. 8, 1992), have been proposed. The former construction includes a plurality of regions in which logic circuits exist, and a clock pulse feeder provided at a position central to the regions, so as to equalize the lengths of the interconnection routes from the feeder to the logic circuits to which the clock pulse is finally fed. The latter construction, which is described herein for purposes of comparison with the invention and does not constitute legal prior art, includes the clock pulse feeder nearly at a center of the layout of the logic circuits. Major branches of the interconnection routes have a broad width, and terminal branches are connected between the major branch and the logic circuits. In this construction, the major branches extend in a vertical direction of a region designed by the user, hereinafter identified as a "user-designed region", and the terminal branches extend in a horizontal direction from the major branch. Each terminal branch connects to almost the same number of logic circuits with almost the same wiring length, so that lengths of the interconnection routes from the clock feeder to each of the logic circuits to which the clock pulse is finally fed, and loads of the circuits, are almost the same.

As the scale of the circuit is increased, however, the problems to be solved by the layout design become more complex, and therefore, it is more difficult to reach optimum solutions. Accordingly, problems, such as a need to allocate more lead time for design, and greater increased chip area requirements, may arise.

One effective approach to solving such problems is to divide the circuit into modules, each of which is individually designed so as to have a suitable layout. When such a layout is designed, each module has user-designed regions, so that a clock feeding circuit is required for feeding exactly the same clock signal to all of the user-designed regions. Moreover, it is also effective to minimize the clock skew of the entire integrated circuit so as both to shrink the chip area and feed the clock pulse at high speed. This may be performed in two stages. In the first stage, the clock skew for each of the user-designed regions is controlled, and in the second stage, the clock skew among the user-designed regions is controlled. To minimize the clock skew among the user-designed regions, the designer must consider differences in delay time based on differences in interconnection routes from the inputs of the clock pulse to the user-designed regions, the interconnection routes within the respective user-designed regions, the loads of the circuits, the drive responses of the circuits, and the like. At the same time, it is of course desirable to minimize the amount of time spent in the design, including the time for controlling the clock skew.

In a process of wiring large integrated circuits, generally, it is impossible to take into account every factor influencing delay times as described above, so that an accurate delay time is difficult to determine until after the layout design is completed. That is, with a conventional clock feeding circuit, it is impossible to eliminate the differences in delay time of the clock pulse among the user-designed regions, even through the differences in delay time within each such region may be eliminated. Therefore, in a case where the clock feeding circuit is divided among a plurality of the user-designed regions, the differences in delay time of the clock pulse over the entire integrated circuit cannot easily be controlled.

SUMMARY OF THE INVENTION

It is an object of the invention to provide an integrated circuit with a clock feeding circuit in which the delay times of the clock pulse, from the source of the clock pulse to the logic circuits to which the clock pulse is fed, is controllable.

It is another object of the invention to provide a method of adjusting clock skew in a clock feeding circuit.

The foregoing objects are accomplished with a clock feeding circuit including a plurality of logic circuit regions, a clock source for feeding a clock signal to the logic circuit regions, and a plurality of adjusting circuits. Each logic circuit region has a plurality of logic circuits, an input buffer for receiving the clock signal and providing the received clock signal to the logic circuits, and interconnections wired among the logic circuits and to the input means, so that clock skew of the clock signal is minimized. The adjusting circuits are disposed between the clock source and the respective logic circuit regions. Each adjusting circuit is composed of a plurality of delay elements, the number of which is pre-selected to adjust the delay of the clock signal passing therethrough.

In accordance with another aspect of the invention, a method for designing an integrated circuit with an adjusted clock skew of a clock signal, comprises the steps of:

(a) creating a schematic representation of an integrated circuit which includes a clock source, a plurality of adjustable delay circuits, and a plurality of logic circuit regions, each region having a plurality of logic circuits, (b) determining a layout and interconnections of each region by which a clock skew of the clock signal transmitted from the clock source to the regions is minimized among the logic circuits of each region, including (1) designing wiring of interconnections among the logic circuits in each region, and connections of the clock source through the respective delay circuits to the regions, and (2) simulating transmission of a clock signal from the clock source to each region to determine delays times of the clock signal from the clock source to the logic circuits of each region;

(c) after step (b), determining by circuit simulation adjustments to the delay circuits which provide a minimum difference between a time delay for the clock signal to reach a logic circuit in a first one of the regions and a time delay for the clock signal to reach a logic circuit in a second one of the regions; and (d) producing an integrated circuit with logic circuit regions according to the layout and interconnections determined in step (b) and with adjusted delay circuits according to step (c).

BRIEF DESCRIPTION OF THE DRAWINGS

The above and other objects and features of the invention will be more completely understood from the following description of the preferred embodiments when considered in conjunction with the accompanied drawings, in which.

DETAILED DESCRIPTION OF THE PREFERRED EMBODIMENTS

Figure 1:
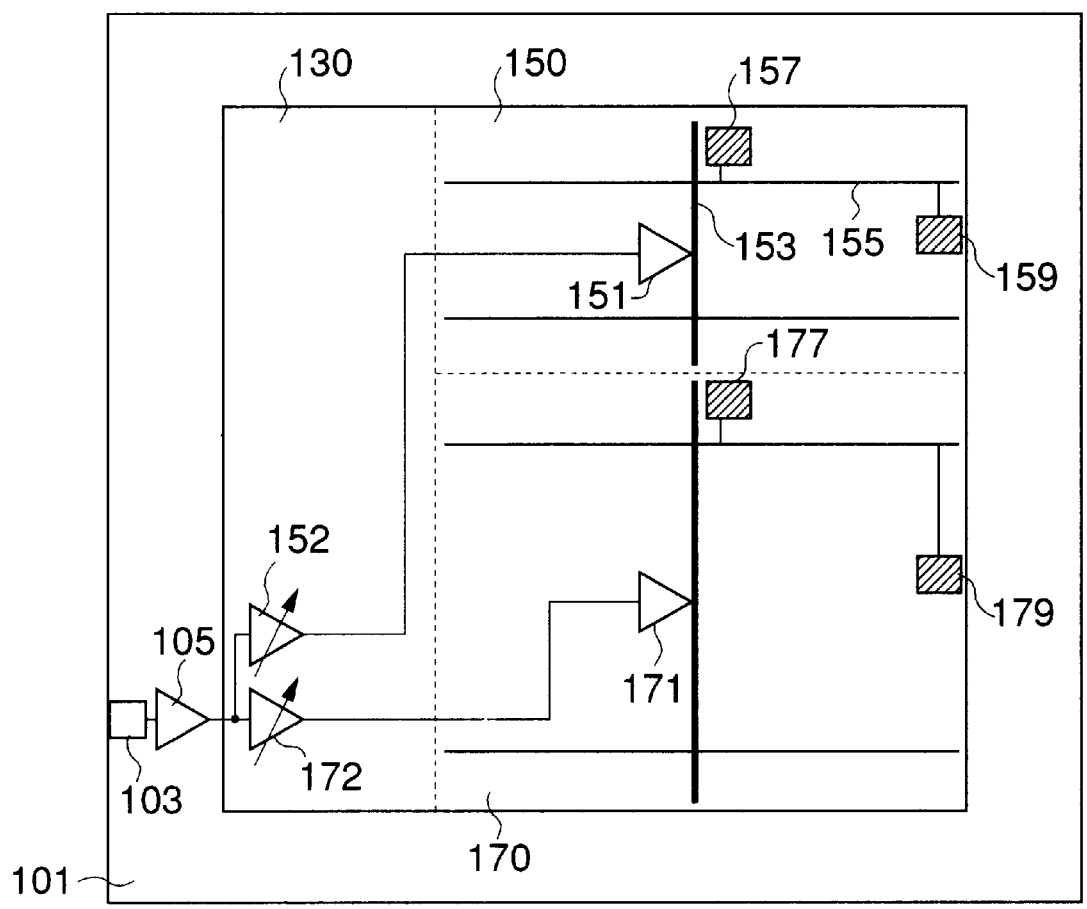
FIG. 1 is an illustration showing a semi-custom-made LSI using a clock feeding circuit according to a preferred embodiment of the invention.

Referring to the drawings, in particular to FIG. 1, there is shown a semi-custom-made LSI, using a clock feeding circuit according to a preferred embodiment of the invention.

The semi-custom-made LSI has a module structure of logic circuits. The modules have user-designed regions, or logic circuit regions, 130, 150, 170, respectively. In the user-designed regions 150, 170, respective pluralities of logic circuits designed by the user, including, for example, logic circuits 157, 159, and 177, 179, are arranged so as to be operative in accordance with a clock signal.

Provided in an I/O area 101 are a clock input terminal 103 for inputting the clock signal, and an input buffer 105 connected to the clock input terminal 103. In the user-designed region 150, a clock pulse feeder or buffer circuit 151 for receiving the clock signal, and interconnections 153, 155 for feeding the clock signal to the logic circuit 159, are provided so as to minimize the clock skew between the logic circuits in the region 150, as described the above-mentioned copending application for U.S. patent Ser. No. 933,345, the disclosure of which is incorporated herein by reference. The clock skew in the user-designed region 170 is similarly minimized.

Figure 5:
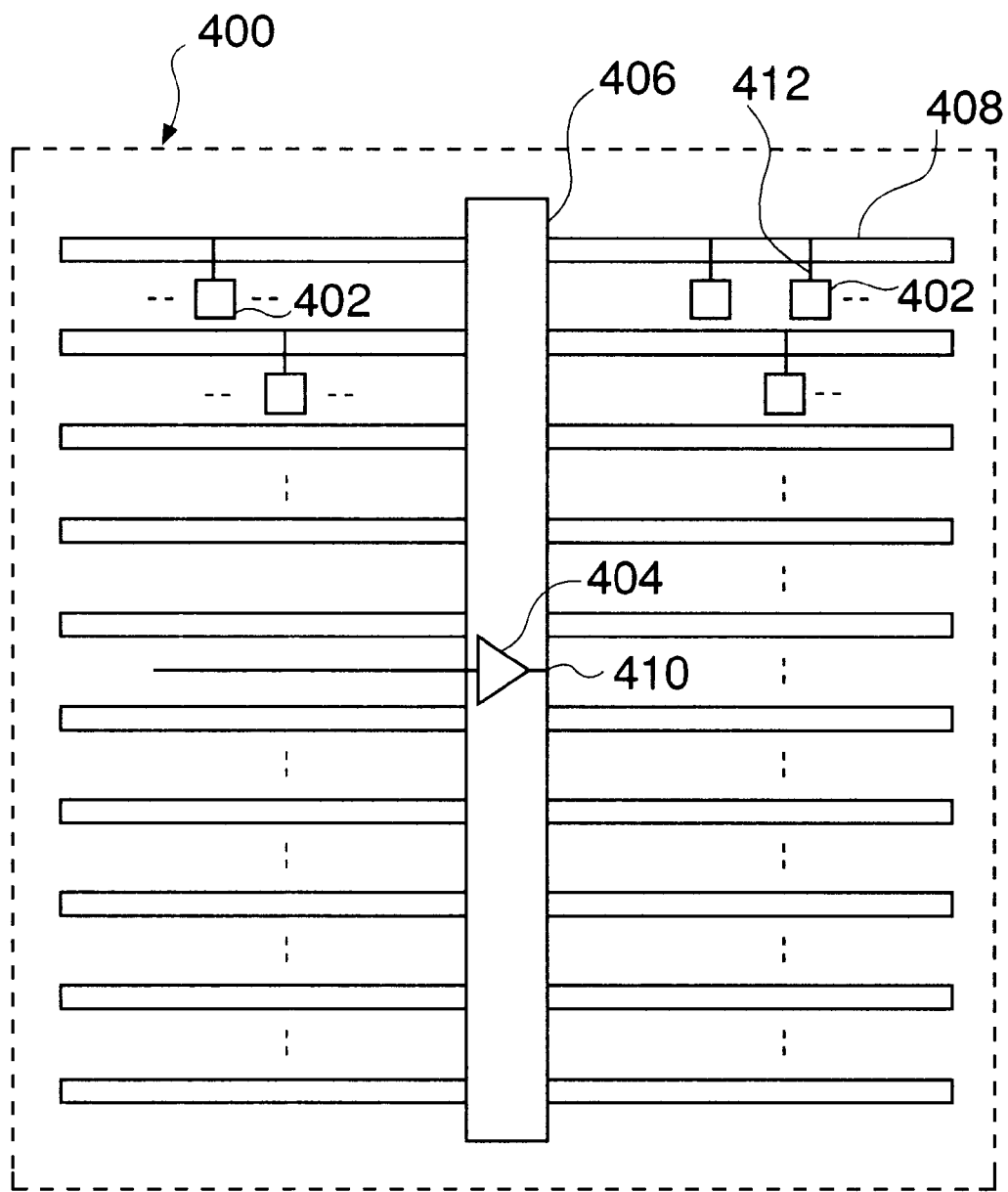
FIG. 5 is an enlarged illustration of a user-designed region.

FIG. 5 illustrates in more detail, a region of a semi-custom-made IC designed in minimize the clock skew in each region, as described the above-mentioned copending application for U.S. patent Ser. No. 933,345 (now U.S. Pat. No. 5,270,592). The logic circuitry of the semi-custom-made IC of this embodiment has a module structure, including a user-designed region 400 corresponding to a respective module. Logic circuits 402 in the region 400 are activated with a clock signal received from a clock input terminal via an input buffer, the input/output (I/O) area as described above with reference to FIG. 1. In the user-designed region 400, a clock pulse feeder or buffer circuit 404 is formed at a center defined with respect to the plurality of the logic circuits 402. The buffer circuit 404 has an ability to drive all of the logic circuits 402. The buffer circuit 404 receives the clock signal from the input buffer in the input/output area.

Upper interconnections are formed in the user-designed region 400 through an insulating layer. The upper interconnections are composed of a main interconnection 406 and a plurality of branch interconnections 408. The main interconnection 406 is formed over the buffer circuit 404 and is connected to the output of the buffer circuit 404 through a contact 410. The main interconnection 406 extends across the user-designed region 400 in a vertical direction at almost the horizontal center of the user-designed region. The main interconnection 406 is designed to have a broad width of, for example, 9.2 μm. The branch interconnections 408 each extend in the horizontal direction of the user-designed region 400, on the both sides of the main interconnection 406. Each branch interconnection is connected to a same number, or almost a same number, of logic circuits, through respective contacts 412. The branch interconnections are formed so that the interconnection lengths, up to the respective logic circuits, are minimized. It is to be noted that the branch interconnections 408 are not required to be arranged on the left and right, that is on both sides of the main interconnection 406, or to be in the same number on both side. It also is not required that the vertical spacing be the same between the successive branch interconnections. In this example, the width of the branch interconnections 406 is designed to 2.4 μm and is broader than that of the remaining interconnections of the user-designed region 400, which have widths of 1.2 μm. The branch interconnections in the different user-designed regions are not necessarily the same.

However, the clock skew in each user-designed region, while minimized, generally will not be zero. The arrival times of the clock pulse at the respective logic circuits of a region (delay times) will generally vary somewhat. For example, in the region 150 shown in FIG. 1, the maximum delay time may be the arrival time of the clock pulse at the logic circuit 159, and the minimum delay time may be the arrival time at the logic circuit 157. Similarly, in the region 170, the maximum delay time may be the arrival time of the clock pulse at the logic circuit 179, and the minimum delay time may be the arrival time at the logic circuit 177.

The present invention is directed primarily to the substantial elimination of variations in the portions of the delay times before reaching the different user-designed regions. For this purpose a delay adjusting circuit 152 is connected between the input buffer 105 and the buffer circuit 151 in the user-designed region 150. In a similar manner, another delay adjusting circuit 172 is connected between the input buffer 105 and a buffer circuit 171 in the user-designed region 170. These delay adjusting circuits 152, 172 are disposed close to the input buffer 105 and are selected so as to minimize or substantially eliminate the time difference between the maximum delay time of the clock signal transmitted from the input buffer 105 to a logic circuit in the region 150, i.e. logic circuit 159, and the maximum delay time of the clock signal transmitted from the input buffer 105 to a logic circuit in the region 170, i.e., logic circuit 179. As a result, all logic circuits to which the clock signal is fed are supplied with the clock signal with minimum time difference.

Figure 4:
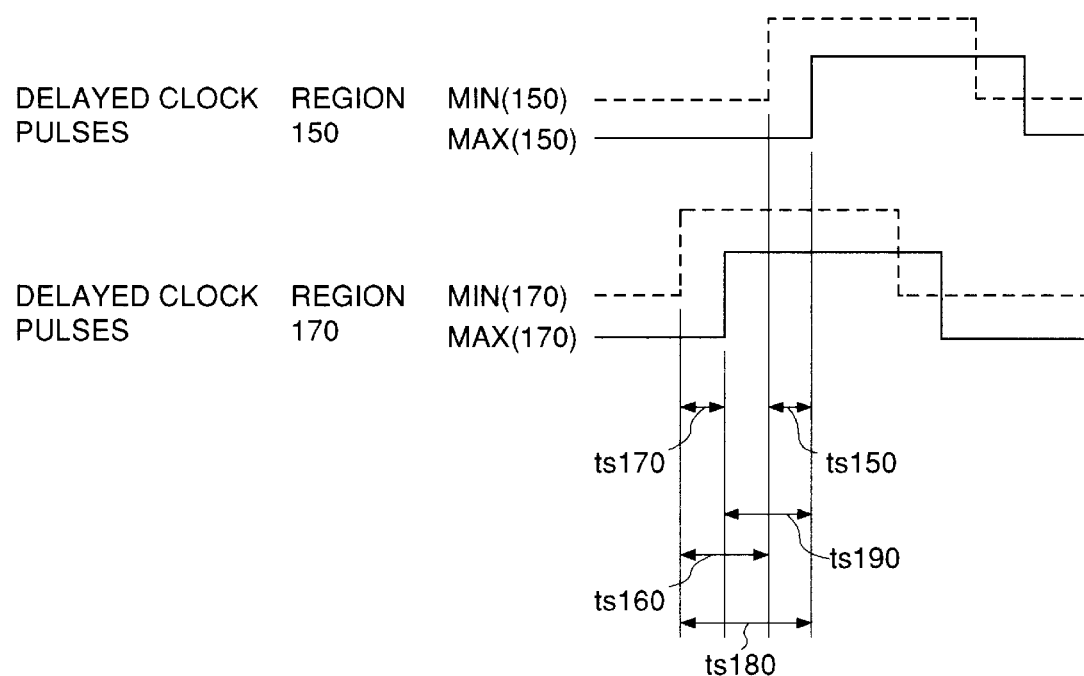
FIG. 4 is a time chart showing differences of arrival times of a clock signal at logic circuits of the user-designed regions.

The function of the delay circuits 152, 172 may be further understood by reference to the timing diagram of FIG. 4. FIG. 4 illustrates the arrival times of the clock pulse at the logic circuits in the embodiment of the LSI shown in FIG. 1, when the delay circuits are omitted, or add equal delay to arrival of the clock signal at the respective regions. In FIG. 4, it is assumed that the logic circuits 157 and 159 are respectively the first and last logic circuits reached by the clock pulse in the region 150. Similarly, it is assumed that the logic circuits 177 and 179 are respectively the first and last logic circuits reached by the clock pulse in the region 170. Thus, the minimum and maximum time delays in the region 150, respectively Min(150) and Max(150), are respectively the time delays of the clock pulse in reaching the logic circuit 157, and the logic circuit 159. Similarly, the minimum and maximum time delays in the region 170, respectively Min(170) and Max(170), are the time delays of the clock pulse in respectively reaching the logic circuit 177, and the logic circuit 179. The time difference ts150 between Min(150) and Max(150) and the time difference ts170 between Min(170) and Max(170) are minimized during the design of the layout and interconnections of the logic circuits of the respective regions.

Once the layout and interconnections are determined, it is an objective of the invention is to narrow the overall range of delay times among the logic circuits of all of the regions, which range is the period ts180 in FIG. 4. In the illustrated embodiment, this is accomplished by equalizing the time delay to the logic circuit which receives the clock pulse first in each region, that is, in FIG. 4 by reducing to zero the time difference ts160 between the minimum delay Min(150) and the minimum delay Min(170). The objective may alternatively be accomplished by equalizing the time delay to the logic circuit which receives the clock pulse last in each region, that is, by reducing the time difference Ts 190 between the maximum delay Max(150) and the maximum delay Max(170). This is implemented in the illustrated embodiment by using the delay circuit 172 to further delay by the time ts160, the clock signal fed to the user-designed region 170, with the result that the time difference ts180 from Min(170) to Max(150) is minimized.

Although in the disclosed embodiment, the time differences ts150, ts170 are almost the same, it is desirable to calculate the difference in time delay of the clock signal among the user-designed regions accurately, based on a mean value of the minimum delay and the maximum delay of the clock signal in the respective user-designed regions. That is, for the accurate reduction of time delay of the clock signal among the user-designed regions, the mean value of the minimum delay and the maximum delay of the clock signal in one user-designed region is equalized to the mean value of the minimum delay and the maximum delay of the clock signal in another user-designed region.

Figure 2:
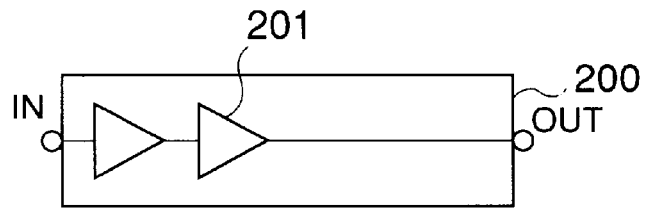
FIG. 2 (a) to FIG. 2 (e) are schematic diagrams illustrating delay adjusting circuits according to the invention.
Figure 2:
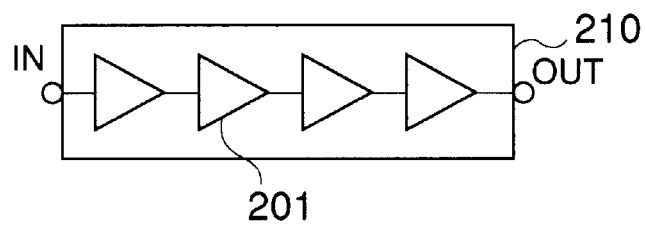
Figure 2:
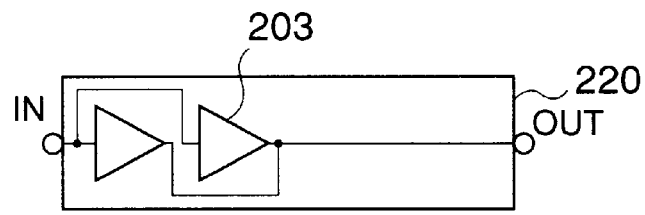
Figure 2:
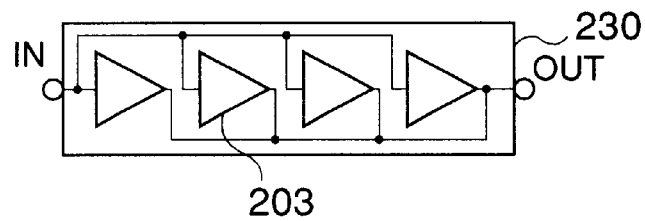
Figure 2:
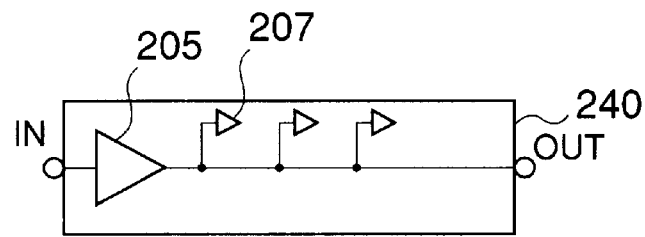

FIGS. 2 (a) to 2 (e) are circuit diagrams of three suitable embodiments of the delay adjusting circuits 152, 172 of FIG. 1. Each circuit has its input IN connected to the output of the buffer circuit 105 and its output OUT connected to the input of one of the buffer circuits 151, 171. These circuits of each embodiment may have different internal delay times, or different drive response characteristics, but have the same size and terminal positions and use transistors having the same characteristics.

FIGS. 2 (a) and 2(b) show a first embodiment, in which an internal delay time of each delay circuit 200, 210 is determined by the number of delay elements 201. FIGS. 2 (c) and 2(d) show a second embodiment, in which the drive response of each delay adjusting circuit 220, 230 is determined by the number of parallel connections of delay elements 203. The drive response of these delay adjusting circuits, if used in the integrated circuit of FIG. 1, controls the delay time of the clock signal between the input buffer 105 and the buffer circuits 151, 171.

FIG. 2(e) shows a third embodiment of the delay adjusting circuit. In the third embodiment, the delay adjusting circuit 240 includes plural loads 207 connected to a delay element 205. The drive response of this delay adjusting circuit is determined by the number of the loads 207.

Figure 3:
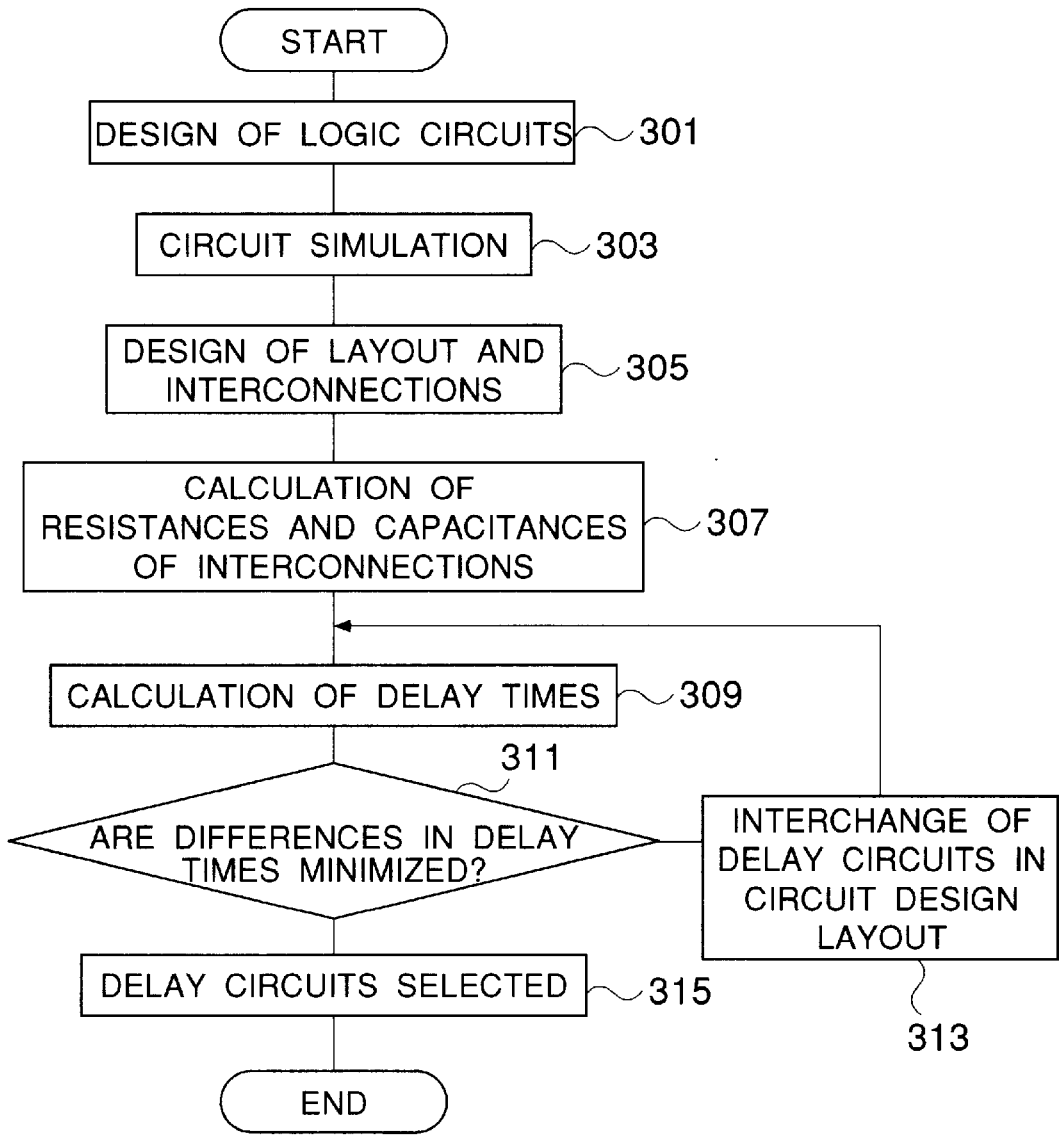
FIG. 3 is a flow chart showing a flow of steps performed in designing a semi-custom-made LSI, according to the invention.

A process for designing the above-described semi-custom-made LSI now will be described with reference to FIG. 1 and the flow diagram of FIG. 3. During this process, appropriate delay adjusting circuits 152, 172, are selected.

Initially, at step 301, the logic of the LSI is designed. During this step, a schematic representation of the circuit is determined and preliminary parameters are assigned to the delay adjusting circuits 152, 172, the circuits being disposed in the region 130 near the input buffer 105, between the input buffer 105 and the buffer circuits 151, 171, of the respective user-designed regions 150, 170. These delay adjusting circuits are initially selected to have the same internal delay time and the same drive response.

Then, automatic circuit simulation procedures (step 303), such as are disclosed in the above-mentioned copending application for U.S. patent Ser. No. 933,345, are used to design the layout and interconnections of each user-designed region (step 305), in such a manner as to minimize the clock skew in each such region. The layouts are designed basically by computerized automatic design (CAD). Referring to FIG. 5 illustrating a design of one region, first, according to the demands of the user, logic circuits 402 are arranged in the user-designed region 400. Next, the vertically extending main interconnection 406 is positioned at the horizontal center of the logic circuits 402. Furthermore, branch interconnections 406 are positioned so that each branch interconnection has an equal load, or so that each branch connection may be connected to the same number of logic circuits 402 at a minimum distance thereto. Then, a clock feed circuit 404 is formed under the main interconnection 406, or in its vicinity, so that an output transistor is disposed to a location that is optimum when seen from the position of the main interconnection 406. Finally, interconnections are formed from each logic circuit 402 to the associated branch interconnection, so that the distance to each branch interconnection is minimized. It is to be noted that the method described above is a method of layout. The actual main interconnection 406 and the branch interconnections 408 are formed later during a manufacturing stage.

After the layout and interconnections are determined, resistance and capacitance values of the interconnections are calculated at step 307. The delay time of the clock signal between the input buffer 105 and a logic circuit in each of the regions, in the present embodiment logic circuits 159, 179, is determined at step 309 by a simulated operation of the circuit.

The delay times calculated at step 309 are compared at step 311, and if the delay times are substantially the same for all of the regions, then the selected delay circuits will be used in the final design of the LSI (step 315). Otherwise, if there is a substantial delay time difference, then at step 313 the delay adjusting circuits 152, 172 are interchanged, in the simulated circuit, with delay adjusting circuits that provide different delay times. Steps 309, 311, and 313 are then repeated until suitable delay adjusting circuits for eliminating the delay time difference between the user-designed regions 150, 170 are determined. Subsequently, of course, an integrated circuit with logic circuit regions according to the layout and interconnections for the adjusted delay circuits according to the determined design may be manufactured by conventional techniques.

According to the invention, the delay adjusting circuits are provided between the input buffer connected to the input terminal for the clock signal, and each of the buffer circuits of the respective user-designed regions. The delay adjusting circuits are used to adjust the delay time of the clock signal, so that even though the clock feeding circuit is divided among a plurality of user-designed regions, differences of time delay, i.e. clock skew, of the clock pulses throughout the entire integrated circuit are minimized.

Therefore, according to the invention, the loads of the interconnections for the clock signal can be reduced, so that a high speed clock signal can be fed to the logic circuits. Moreover, the locations of the interconnections of the logic circuits can be designed easily, which facilitates shrinkage of the size of the chip. It is also possible to adjust clock skew as between user-designed regions, without changing the layout and shapes of the interconnections after the design of the layout has been completed. Therefore, the delay times are adjustable without increasing the amount of time required to design the layout.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. An integrated circuit formed as a semi-custom-made LSI device having a conductive pattern, the integrated circuit comprising:
   a plurality of logic circuit regions, each region having
      a plurality of logic circuits,
      an input circuit for receiving a clock signal and providing the received clock signal to each of said plurality of logic circuits, and
      interconnections formed by the conductive pattern, the interconnections electrically connecting said plurality of logic circuits and said input circuit, so that a clock skew of the clock signal is minimized among said plurality of logic circuits;
   a clock source for feeding said clock signal to said regions; and
   a plurality of adjusting circuits, each adjusting circuit disposed between said clock source and a respective one of said regions, each adjusting circuit delaying transmission of the clock signal to the respective region, said each adjusting circuit including a predetermined number of delay elements selectively connected between said clock source and the respective one of said regions with the conductive pattern so as to adjust the amount of the delay of the clock signal.

2. An integrated circuit according to claim 1, wherein said adjusting circuits equalize the delay time for the clock signal to reach a selected one of the logic circuits in each of said regions.

3. An integrated circuit according to claim 2, wherein for each of said regions, the selected logic circuit is the logic circuit for which the delay time is minimum among the logic circuits in said region.

4. An integrated circuit according to claim 2, wherein for each of said regions, the selected logic circuit is the logic circuit for which the delay time is maximum among logic circuits in said region.

5. An integrated circuit according to claim 1, wherein said adjusting circuits equalize in each of said regions, the mean time delay for the clock signal to the different logic circuits of the region.

6. An integrated circuit according to claim 1, wherein the predetermined number of delay elements are connected in series.

7. An integrated circuit according to claim 1, wherein the predetermined number of delay elements are connected in parallel.

8. An integrated circuit according to claim 1, wherein the predetermined number of delay elements includes a changeable number of loads.

9. A method for designing an integrated circuit formed as a semi-custom-made LSI device with an adjusted clock skew of a clock signal, the method comprising the steps of:
   (a) providing a clock source, a plurality of delay circuit forming regions each of which has a predetermined number of delay elements, and a plurality of logic circuit regions, each logic circuit region having a plurality of logic circuits;
   (b) simulating a first hypothetical interconnection between the plurality of logic circuits in each logic circuit region so that the clock skew of the clock signal is minimized among the logic circuits of each logic circuit region, and simulating a second hypothetical interconnection between the clock source and each logic circuit region via the respective delay circuit forming regions;
   (c) simulating delay times of the clock signal from the clock source to the logic circuits in the respective logic circuit regions; and
   (d) making a real interconnection with a conductive pattern, the real interconnection including first and second portions which are made in accordance with the first and second hypothetical interconnections simulated in said step (b), part of the second portion connecting delay elements selected from among the predetermined number of delay elements in accordance with the delay times simulated in said step (c), so as to form a plurality of delay circuits in the delay circuit forming regions respectively,
   wherein each of the delay circuits has an adjusted delay time.

10. A method for designing an integrated circuit formed as a semi-custom-made LSI device with an adjusted clock skew of a clock signal, the method comprising the steps of:
   (a) creating a schematic representation of an integrated circuit which includes a clock source, a plurality of adjustable delay circuit regions each of which has a predetermined number of delay elements, and a plurality of logic circuit regions, each region having a plurality of logic circuits,
   (b) determining a layout and interconnections of each logic circuit region by which a clock skew of the clock signal transmitted from the clock source to the logic circuit regions is minimized among the logic circuits of each logic circuit region, including
      (1) designing an interconnection among the plurality of logic circuits in each logic circuit region, and connections of the clock source through the respective delay circuit regions to the logic circuit regions, of the integrated circuit represented in step (a), and
      (2) simulating transmission of a clock signal from the clock source to each logic circuit region to determine delay times of the clock signal from the clock source to the logic circuits of each logic circuit region; and (c) producing a conductive pattern having a first portion for the logic circuit regions according to the layout and interconnections determined in said step (b-1) and a second portion for the adjustable delay circuit regions according to said step (b-2), the second portion electrically connecting a selected number of the delay elements in each adjustable delay circuit region so as to form adjusted delay circuits.

11. An integrated circuit formed as a semi-custom-made LSI device having a conductive pattern, the integrated circuit comprising:

an input terminal for receiving the clock signal;

an input buffer circuit having an input coupled to said input terminal and an output for feeding the clock signal;

a first logic circuit region having,
a first input terminal coupled for receiving the clock signal,
a first buffer circuit having an input coupled to the first input terminal and an output for feeding the clock signal, and
a plurality of first logic circuits coupled to the output of the first buffer, each of the first logic circuits receiving the clock signal with a first delay time;

a second logic circuit region having,
a second input terminal coupled for receiving the clock signal,
a second buffer circuit having an input coupled to the second input terminal and an output for feeding the clock signal, and
a plurality of second logic circuits coupled to the output of the second buffer, each of the second logic circuits receiving the clock signal with a second delay time;

a first adjusting circuit coupled between the output of said input buffer circuit and the first input terminal for delaying the clock signal therethrough so as to adjust the first delay time, said first adjusting circuit having an input, an output and a predetermined number of delay elements, a number of the delay elements being selected in accordance with a delay time of the clock signal fed by said first adjusting circuit and being connected between the input and output of said first adjusting circuit with the conductive pattern; and a second adjusting circuit coupled between the output of said input buffer circuit and the second input terminal for delaying the clock signal therethrough so as to adjust the second delay time, said second adjusting circuit having an input, an output and a predetermined number of delay elements, a number of the delay elements being selected in accordance with a delay time of the clock signal fed by said second adjusting circuit and being connected between the input and output of said second adjusting circuit with the conductive pattern.

12. An integrated circuit according to claim 11, wherein said first and second adjusting circuits are formed in first and second adjusting circuit regions respectively, and wherein each of the first and second adjusting circuit regions has the same area.

* * * * *